United States Patent
Chao et al.

(10) Patent No.: US 10,203,606 B1
(45) Date of Patent: Feb. 12, 2019

(54) APPARATUS AND METHOD FOR DISPENSING DEVELOPER ONTO SEMICONDUCTOR SUBSTRATE

(71) Applicant: Taiwan Semiconductor Manufacturing Co., Ltd., Hsinchu (TW)

(72) Inventors: Chia-Cheng Chao, Hsinchu (TW); Chung-Cheng Wang, Hsinchu (TW); Chun-Kuang Chen, Guanxi Township, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/873,944

(22) Filed: Jan. 18, 2018

Related U.S. Application Data (60) Provisional application No. 62/589,604, filed on Nov. 22, 2017.

(51) Int. Cl.
  *G03D 3/00* (2006.01)
  *G03F 7/30* (2006.01)
  *G03F 7/16* (2006.01)

(52) U.S. Cl.
  CPC ............ *G03F 7/3021* (2013.01); *G03F 7/162* (2013.01)

(58) Field of Classification Search
  USPC ........................................ 396/564, 604, 611
  See application file for complete search history.

(56) References Cited

U.S. PATENT DOCUMENTS

| | | | | |
|---|---|---|---|---|
| 5,625,433 A | * | 4/1997 | Inada | G03F 7/3021 396/604 |
| 5,845,170 A | * | 12/1998 | Ogata | G03F 7/3021 396/604 |
| 6,089,762 A | * | 7/2000 | Mimasaka | G03D 5/04 396/611 |
| 6,248,171 B1 | * | 6/2001 | Gurer | B05C 5/027 118/300 |
| 7,387,455 B2 | * | 6/2008 | Awamura | G03F 7/30 396/564 |
| 9,027,508 B2 | * | 5/2015 | Hatakeyama | H01L 21/02282 118/695 |
| 2001/0009452 A1 | * | 7/2001 | Matsuyama | G03F 7/3021 355/27 |
| 2001/0043813 A1 | * | 11/2001 | Kitamura | G03D 5/04 396/564 |
| 2009/0130614 A1 | * | 5/2009 | Ookouchi | G03F 7/3021 430/434 |
| 2010/0216078 A1 | * | 8/2010 | Yamamoto | G03F 7/3021 430/434 |
| 2018/0019112 A1 | * | 1/2018 | Kai | H01L 21/31144 |

* cited by examiner

*Primary Examiner* — Rodney E Fuller
(74) *Attorney, Agent, or Firm* — McClure, Qualey & Rodack, LLP (57) ABSTRACT

A dispensing head for dispensing a developer onto a substrate is provided. The dispensing head includes a housing configured to receive the developer. The dispensing head further includes at least one liquid outlet provided on the housing. The liquid outlet is configured to spray the developer onto an elongated area on the substrate. Also, the liquid outlet is configured to spray the developer along a dispensing direction that is tilted with respect to the normal direction of the substrate and perpendicular to the long-axis direction of the elongated area.

20 Claims, 11 Drawing Sheets

Spraying the developer onto an elongated area on the substrate, the elongated area being extending along a first direction, and the developer is sprayed along a second direction that is tilted with respect to the normal direction of the substrate and perpendicular to the first direction —81

↓

Rotating the substrate to spread the developer over the substrate —82

↓

Stopping spraying the developer on the substrate and stopping rotating the substrate when the developer is distributed over the entire substrate —83

APPARATUS AND METHOD FOR DISPENSING DEVELOPER ONTO SEMICONDUCTOR SUBSTRATE

CROSS REFERENCE TO RELATED APPLICATIONS

The present application claims priority of U.S. Provisional Patent Application No. 62/589,604, filed on Nov. 22, 2017, the entirety of which is incorporated by reference herein.

BACKGROUND

The semiconductor integrated circuit (IC) industry has experienced exponential growth. Technological advances in IC materials and design have produced generations of ICs, wherein each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. The fabrication processes include various common processes, such as deposition processes, photolithography process, etching processes, and the like. Therefore, it is a challenge to form reliable semiconductor devices at smaller and smaller sizes.

BRIEF DESCRIPTION OF THE DRAWINGS

For a more complete understanding of the present disclosure, and the advantages of the present disclosure, reference is now made to the following descriptions taken in conjunction with the accompanying drawings, in which.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Various features may be arbitrarily drawn in different scales for the sake of simplicity and clarity.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
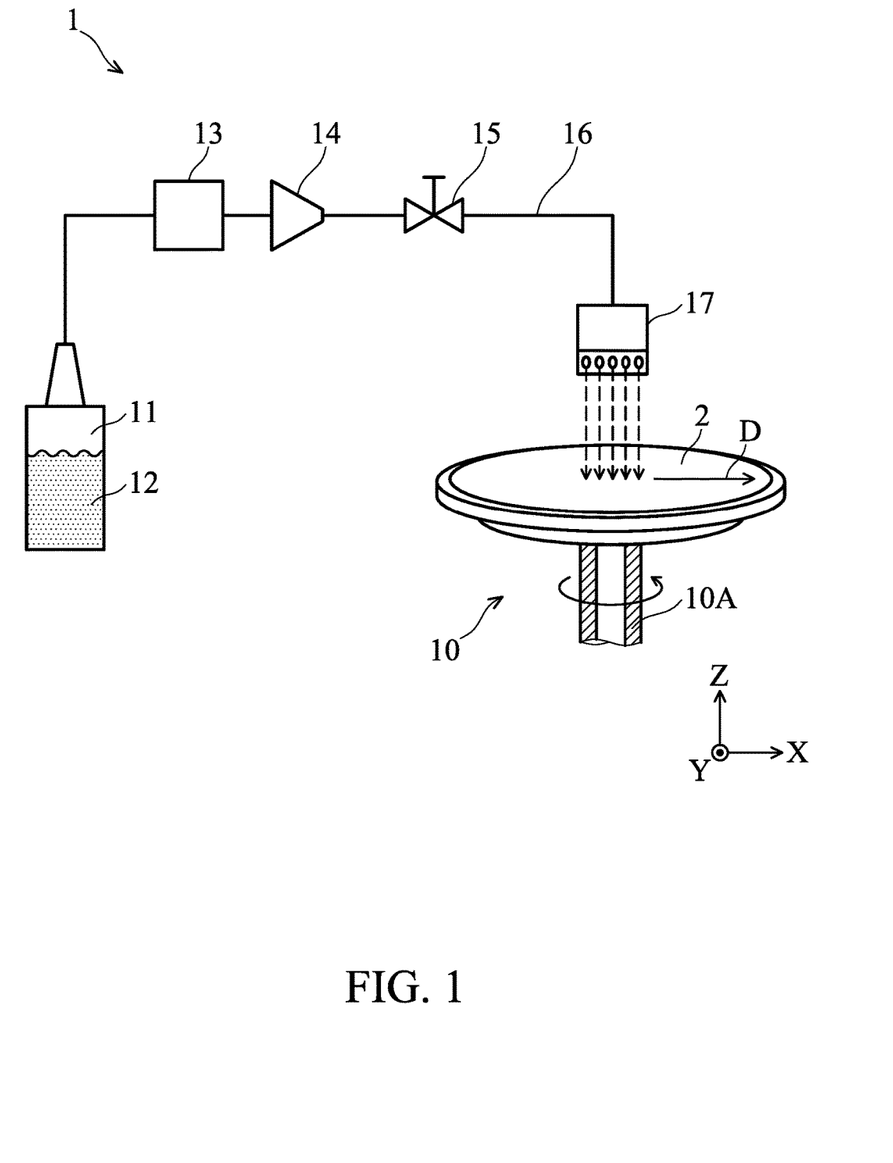
FIG. 1 is a schematic view of a developer dispensing apparatus in accordance with some embodiments.

FIG. 1 schematically shows a developer dispensing apparatus 1 for performing a photoresist development step in a lithography process, in accordance with some embodiments. During the photoresist development step, the developer dispensing apparatus 1 dispenses a developer (solution) over a substrate 2 to dissolve the soluble regions of the photoresist layer (not shown) that were formed during a mask or reticle exposure step in the lithography process.

The photoresist layer may be either negative or positive photoresist. In the case of negative photoresist, the soluble, unexposed regions of the photoresist layer on the substrate 2 can be dissolved by the developer, and the insoluble, cross-linked exposed regions remain in the form of the circuit pattern. In the case of positive photoresist, the soluble, exposed regions of the photoresist layer on the substrate 2 can be dissolved by the developer, and the insoluble, unexposed regions remain in the form of the circuit pattern.

The substrate 2 may be a semiconductor wafer made of silicon or other semiconductor materials. Alternatively or additionally, the substrate 2 may comprise other elementary semiconductor materials such as germanium (Ge). In accordance with some embodiments, the substrate 2 is made of a compound semiconductor such as silicon carbide (SiC), gallium arsenic (GaAs), indium arsenide (InAs), or indium phosphide (InP). In accordance with some embodiments, the substrate 2 is made of an alloy semiconductor such as silicon germanium (SiGe), silicon germanium carbide (SiGeC), gallium arsenic phosphide (GaAsP), or gallium indium phosphide (GaInP). In accordance with some embodiments, the substrate 2 comprises an epitaxial layer. For example, the substrate 2 has an epitaxial layer overlying a bulk semiconductor. In some other embodiments, the substrate 2 is a silicon-on-insulator (SOI) or a germanium-on-insulator (GOI) substrate.

Referring to FIG. 1, in some embodiments, the developer dispensing apparatus 1 includes a substrate stage 10, a storage unit 11, a pump 13, a filter 14, a valve 15, a conduit 16, and a dispensing head 17. It should be noted that some additional elements can be added into the developer dispensing apparatus 1, and some of the elements described below can be replaced or eliminated in other embodiments of the developer dispensing apparatus 1.

In some embodiments, the substrate stage 10 is configured to hold, position, move, and otherwise manipulate the substrate 2 during the photoresist development step. The substrate stage 10 is positioned relative to the dispensing head 17 so as to allow a developer 12 from the dispensing head 17 (which will be further illustrated below) to be sprayed onto the substrate 2 placed on the substrate stage 10. In some embodiments, the substrate 2 is secured on the substrate stage 10 by a clamping mechanism (not shown), such as vacuum clamping or e-chuck clamping. In some embodiments, the substrate stage 10 is also driven by a driving mechanism (not shown) to move the substrate 2 (e.g. along the Z-axis direction in the figures) and/or rotate the substrate 2 (e.g. around a spindle 10A of the substrate stage 10).

In some embodiments, the developer 12 is stored in the storage unit 11. The storage unit 11 may have a relatively large volume and may be used to store the developer 12 for a relatively long period before being sprayed onto the substrate 2. The developer 12 may be a positive tone developer (PTD) or a negative tone developer (NTD). The PTD is used to selectively dissolve and remove the exposed region of the photoresist layer on the substrate 2. In some embodiments, the PTD is an aqueous alkaline developer, such as aqueous tetramethylammonium hydroxide (TMAH) or the like. The NTD is used to selectively dissolve and remove the unexposed region of the photoresist layer on the substrate 2. In some embodiments, the NTD includes an organic solvent, such as n-butyl acetate (NBA) or the like. In other some embodiments, the developer 12 comprises de-ionized water.

In some embodiments, the developer dispensing apparatus 1 further includes a number of storage units 11 used to store developers 12. The developer 12 in each storage unit 11 may include the same type of developer or different types of developer. In addition, the storage units 11 may be the same type or different types. In some embodiments, the conduit 16 is configured to fluidly connect the storage unit 11 and the dispensing head 17.

In some embodiments, the pump 13 is provided in the conduit 16 and configured to receive the developer 12 from the storage unit 11 and pump it to the dispensing head 17 to spray the developer 12 onto the substrate 2. The pump 13 may be driven by a motor (not shown) and may be various conventional pumps such that a predetermined quantity of the developer 12 can be pushed out through the dispensing head 17 to the substrate 2.

In some embodiments, the valve 15 is provided in the conduit 16 and positioned between the pump 13 and the dispensing head 17. The valve 15 is configured to regulate the flow of the developer 12 from the pump 13 to the dispensing head 17. In some embodiments, the developer dispensing apparatus 1 further includes a control unit (e.g. a host computer; not shown) configured to control the operation of valve 15. In some embodiments, the developer dispensing apparatus 1 further includes a sensor (not shown) positioned in the conduit 16. The sensor senses a flow rate of the developer 12 passing through the valve 15. If an overflow of the developer 12 to the substrate 2 occurs, the sensor sends out a signal to the control unit, stopping the developer 12 from spraying onto the substrate 2 by shutting off the valve 15.

In some embodiments, the filter 14 is provided in the conduit 16 and configured to filter undesired particles from the developer 12. The filter 14 can be arranged at any position within the conduit 16. In some embodiments, the filter 14 is positioned between the pump 13 and the valve 15, and the developer 12 is pressurized by the pump 13 to the filter 14. After being filtered, the developer 12 is sent to the dispensing head 17 via the valve 15 and conduit 16.

In some embodiments, the dispensing head 17 is connected to one end of the conduit 16 for supplying the developer 12 from the storage unit 11 onto the substrate 2. In some embodiments, the dispensing head 17 is movable via a driving mechanism (e.g. a motor; not shown) between a home/rest position and a dispensing position. In the dispensing position, as shown in FIG. 1, the dispensing head 17 sprays the developer 12 onto a center area of the substrate 2 in a static state (i.e., the dispensing head 17 does not move horizontally to change the dispensing area while it sprays the developer 12 onto the substrate 2). In some embodiments, the dispensing head 17 is further lowered (e.g. along the Z-axis direction in the figures) via another driving mechanism (e.g. a cylinder; not shown) to the dispensing position and then sprays the developer 12 onto the substrate 2. Before or after the photoresist development step, the dispensing head 17 rests in the home position away from the substrate 2.

Figure 2:
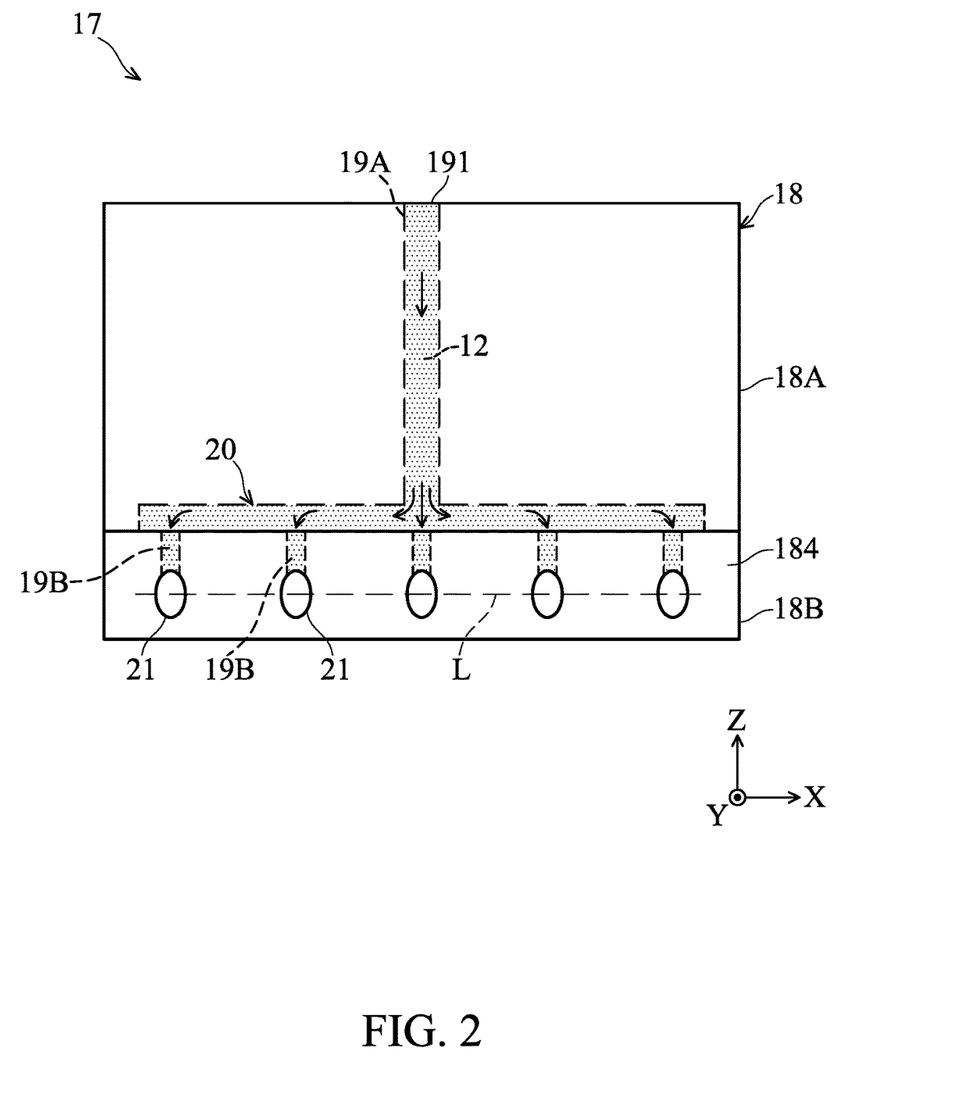
FIG. 2 is an enlarged view of the dispensing head in FIG. 1, wherein the structure and/or component in the dispensing head are depicted as dashed lines.
Figure 3:
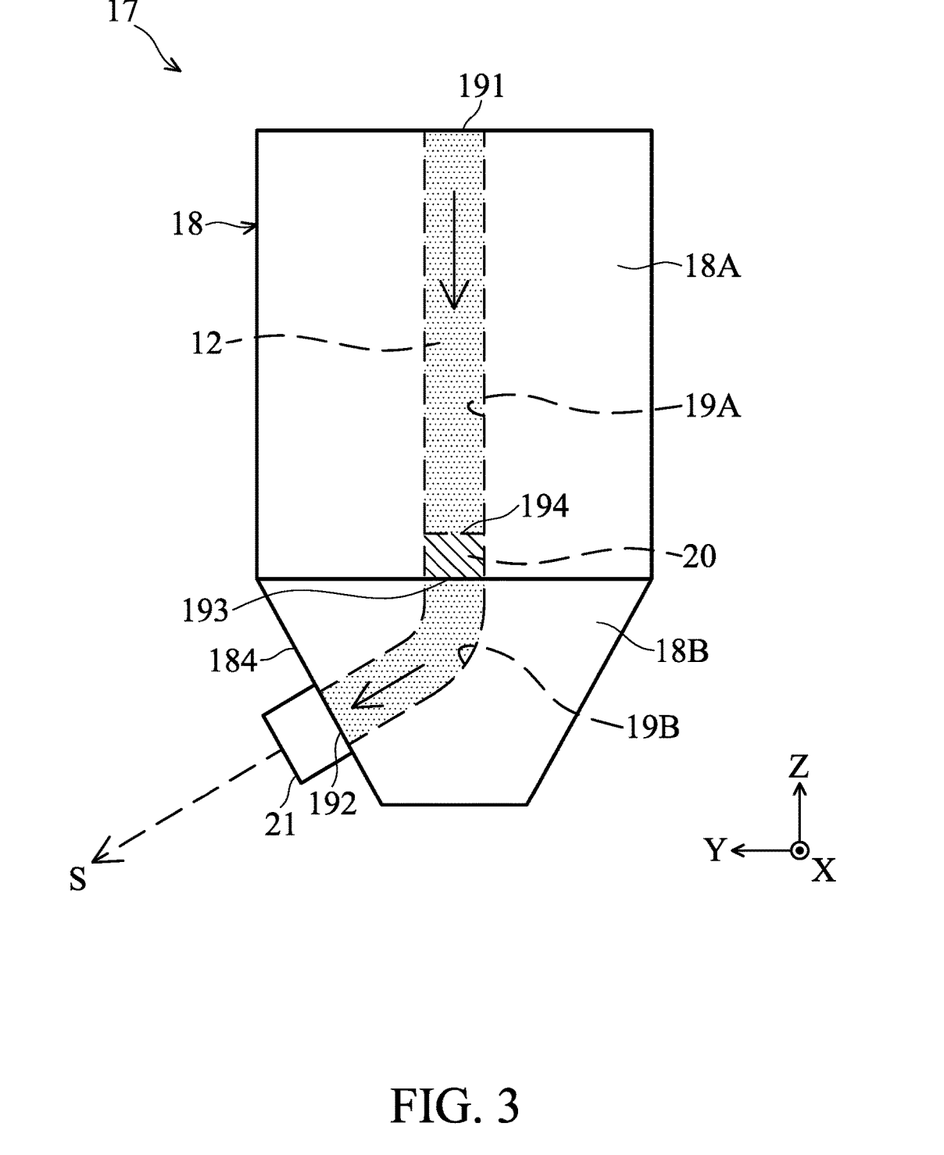
FIG. 3 is an enlarged view of the dispensing head in FIG. 1 from another viewing angle, wherein the structure and/or component in the dispensing head are depicted as dashed lines.

FIGS. 2 and 3 are enlarged views of the dispensing head 17 in FIG. 1 from different viewing angle, wherein the structure and/or component in the dispensing head 17 are depicted as dashed lines. The dispensing head 17 includes a housing 18 configured to receive the developer 12 from the conduit 16 (FIG. 1). In some embodiments, the housing 18 has a first liquid conduit 19A provided therein. The first liquid conduit 19A has a liquid inlet 191 located on an upper side of the housing 18 for receiving the developer 12 from the conduit 16. In some embodiments, the first liquid conduit 19A is a pipeline made of Polytetrafluoroethene (PTFE), Polyfluoroalkoxy (PFA), or the like.

In some embodiments, the housing 18 also has a number of second liquid conduits 19B provided therein. As shown in FIG. 2, five second liquid conduits 19B are provided in the housing 18 according to certain embodiments. In other some embodiments, the number of the second liquid conduits 19B may be two, three, four, or more than five. Each second liquid conduit 19B has a liquid outlet 192 located on a lower side of the housing 18 for spraying the developer 12 onto the substrate 2 (FIG. 1). In some embodiments, each second liquid conduit 19B is a pipeline comprising the same material as or different material from the first liquid conduit 19A.

In some embodiments, the housing 18 further has a liquid rectifier 20 provided between and interconnecting the first liquid conduit 19A and the second liquid conduits 19B. The developer 12 in the first liquid conduit 19A is evenly distributed into the second liquid conduits 19B via the liquid rectifier 20. In some embodiments, the liquid rectifier 20 may be various conventional liquid rectifiers that can direct the liquid from one pipeline to a number of pipelines evenly.

In some embodiments, the housing 18 includes an upper housing part 18A and a lower housing part 18B. The upper housing part 18A and the lower housing part 18B can be manufactured independently and then combined together by, for example, locking mechanisms (such as screws and thread recesses). Alternatively, the upper housing part 18A and the lower housing part 18B can be integrally formed in one-piece. The upper housing part 18A and the lower housing part 18B may comprise metal (e.g. stainless steel) or another suitable material.

Figure 4A:
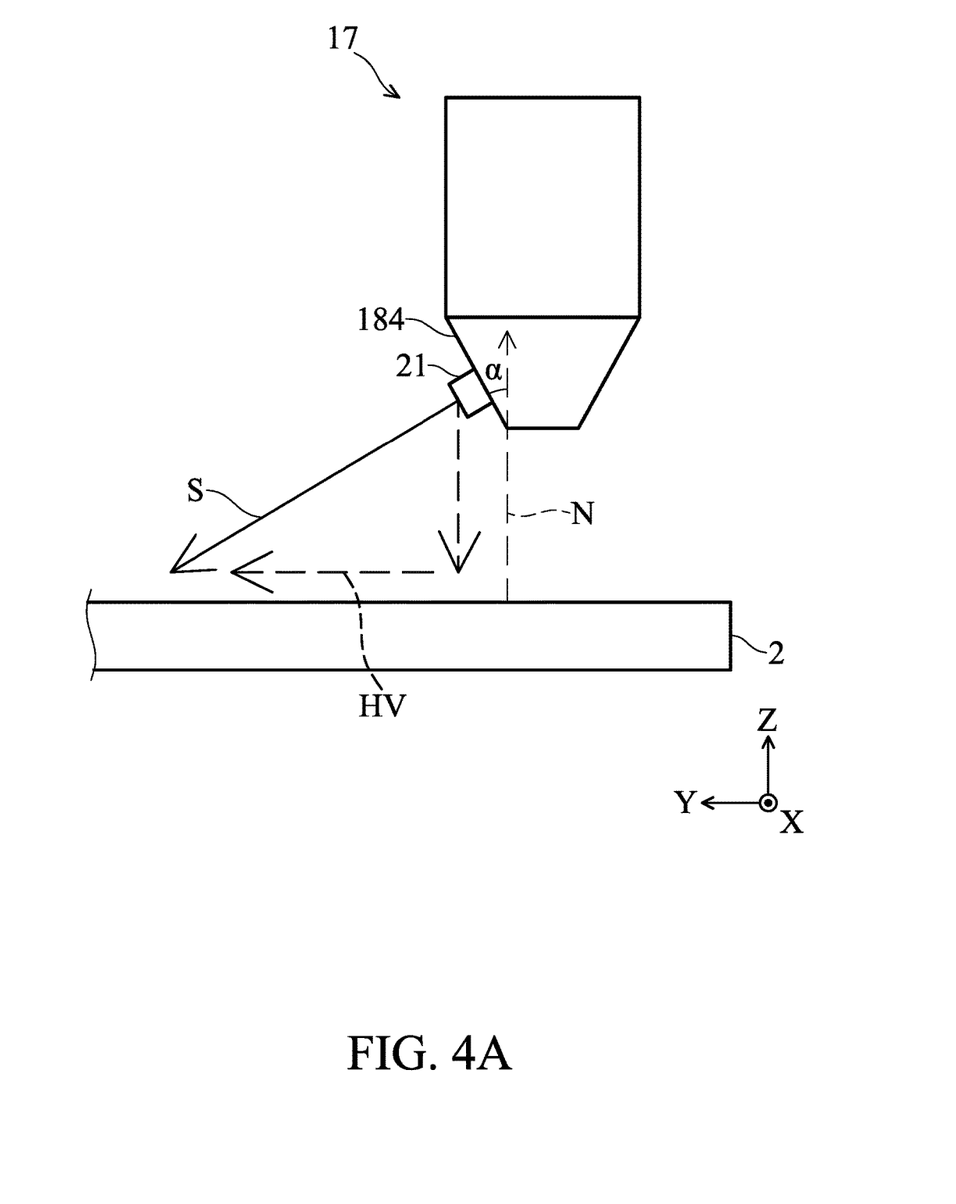
FIG. 4A schematically shows that the dispensing head in FIG. 1 sprays a developer onto a substrate in an oblique manner.

In some embodiments, the first liquid conduit 19A is provided in the upper housing part 18A and arranged substantially along a vertical direction (e.g., the Z-axis direction in the figures, as well as the normal direction N of the substrate 2 as shown in FIG. 4A). The liquid inlet 191 of the first liquid conduit 19A may connect to an upper side of the upper housing part 18A in such embodiments.

In some embodiments, the second liquid conduits 19B are provided in the lower housing part 18B. Each second liquid conduit 19B may be bent and have a liquid inlet 193 located on an upper side of the lower housing part 18B and a liquid outlet 192 located on an inclined surface 184 of the lower housing part 18B close to the substrate 2.

In some embodiments, the inclined surface 184 is an elongated surface (e.g. a long rectangular surface) having a long-axis L that extends along a horizontal direction (e.g. the X-direction in the figures, as well as a linear direction D from a center to an edge of the substrate 2 as shown in FIG. 1). The liquid outlets 192 may be arranged in a row along the long-axis L of the inclined surface 184 (note that the liquid outlets 192 are positioned correspondingly behind a number of nozzles 21, which will be described below, and thus cannot be seen from FIG. 2). In some embodiments, the liquid outlets 192 are arranged and spaced apart at equal intervals. In addition, the liquid outlets 192 may have the same shape and/or size.

In some embodiments, as shown in FIG. 4A, the inclined surface 184 is arranged such that an angle α (e.g. about 30 degrees to about 60 degrees) is formed between the inclined surface 184 and the normal direction N of the substrate 2. The angle α affects a horizontal flowing velocity HV of the developer (from the liquid outlets 192 or nozzles 21) onto the substrate 2, as well as the spreading rate of the developer on the substrate 2. For example, when the angle α is within a range of about 30 degrees to about 60 degrees, the developer can be spread over the substrate 2 rapidly and also have an appropriate reaction time with the photoresist on the substrate 2. However, when the angle α is greater than about 60 degrees, the developer will be dispensed almost vertically on the substrate 2 and cannot be spread over the substrate 2 rapidly, causing different reaction time of the developer with the photoresist at the center region and at the edge region of the substrate 2. On the other hand, when the angle α is less than about 30 degrees, the developer will flow through the substrate 2 so fast that the developer has insufficient reaction time with the photoresist on the substrate 2.

In some embodiments, the liquid rectifier 20 is provided on the top of the lower housing part 18B and connects a liquid outlet 194 of the first liquid conduit 19A and the liquid inlets 193 of the second liquid conduits 19B, as shown in FIG. 3. In some embodiments, O-rings made of rubber or the like are provided at the junctions between the liquid rectifier 20, first liquid conduit 19A, and second liquid conduits 19B to avoid leakage of the developer 12.

In some embodiments, the dispensing head 17 further includes a number of nozzles 21 disposed on the inclined surface 184 of the lower housing part 18B and connected to the liquid outlets 192 (i.e., the number of the nozzles 21 corresponds to that of the liquid outlets 192). The nozzles 21 extend from the inclined surface 184 toward a predetermined dispensing direction S of the developer 12. In some embodiments, an angle more than zero degrees is formed between the inclined surface 184 and the dispensing direction S. For example, the dispensing direction S may be perpendicular to the inclined surface 184.

The nozzles 21 are configured to adjust the pressure or flowing speed of the developer 12 sprayed from the liquid outlets 192 of the dispensing head 17. In some exemplary embodiments, the nozzles 21 are arranged at equal intervals (e.g. about 6 mm), corresponding to the liquid outlets 192. In addition, the nozzle holes (not shown) of the nozzles 21 may have the same shape (e.g. circular shape) and size (e.g. about 1.3 mm to about 1.8 mm). In some exemplary embodiments, the dispensing head 17 sprays the developer 12 through the nozzles 21 at the same time and at the same speed (e.g. about 150 ml/min to about 300 ml/min). In some embodiments of the dispensing head 17, the nozzles 21 are omitted and the liquid outlets 192 of the second liquid conduits 19B are each designed with a nozzle structure.

Figure 4B:
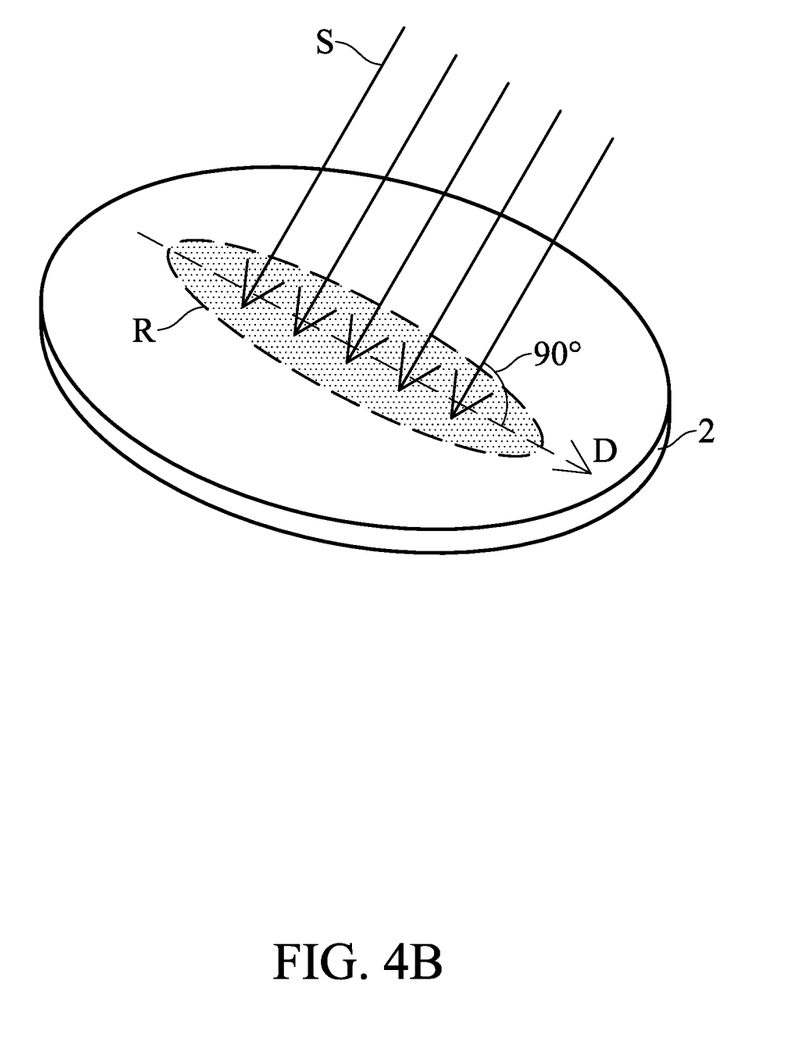
FIG. 4B schematically shows that the dispensing direction of developer is perpendicular to the long-axis direction of the dispensing area on the substrate.

With the above arrangement, the dispensing head 17 can spray the developer 12 onto an elongated area R (see FIG. 9) on the substrate 2 simultaneously (i.e., at one dispense) via the liquid outlets 192 or the nozzles 21, wherein the elongated area R includes a plurality of dies along a linear direction D of the substrate 2. It should be appreciated that the dispensing area using the dispensing head 17 at one time is increased, compared to an existing dispensing head which dispenses to cover a dispensing area of about one die size at one time. Furthermore, as shown in FIG. 4A, the dispensing head 17 sprays the developer 12 onto the substrate 2 along a dispensing direction S that is tilted with respect to the normal direction N of the substrate 2 (also perpendicular to the long-axis direction of the elongated area R, as shown in FIG. 4B), so that the developer 12 can be spread over the substrate 2 rapidly due to the horizontal flowing velocity HV and still have enough reaction time with the photoresist on the substrate 2. Accordingly, the critical dimension uniformity (CDU) and the critical dimension range (either within-die or across-dies on the substrate 2) in the photoresist development step using the dispensing head 17 can be improved (i.e. reduced). As a result, the fabrication yield of the lithography process is also improved.

It should also be appreciated that many variations and modifications can be made to the embodiments of the disclosure.

Figure 5:
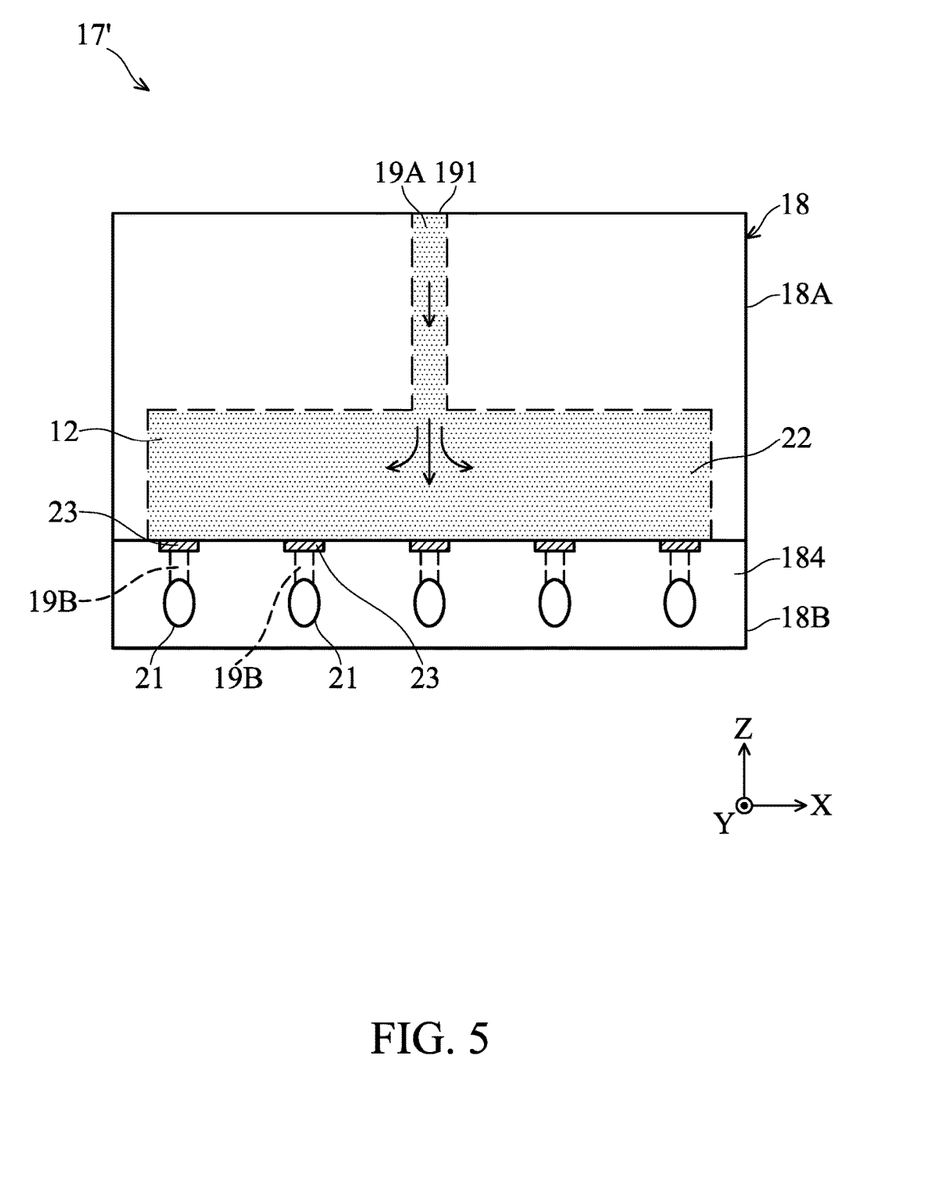
FIG. 5 schematically shows the structure and/or component in a dispensing head in accordance with some embodiments.

FIG. 5 schematically shows the structure and/or component in a dispensing head 17' in accordance with other some embodiments. The dispensing head 17' differs from the dispensing head 17 described above in that a tank 22 is provided between and interconnecting the first liquid conduit 19A and the second liquid conduits 19B, e.g. formed in the upper housing part 18A (where the liquid rectifier 20 in FIGS. 2 and 3 is omitted), and a number of control valves 23 are correspondingly/respectively provided in the second liquid conduits 19B. In some embodiments, the control valves 23 (e.g. pneumatic valves) stops the developer 12 in the tank 22 from entering the second liquid conduits 19B when the developer 12 is initially injected into the tank 22 through the first liquid conduit 19A. When the tank 22 is full of the developer 12, the control valves 23 receives a signal from a sensor (e.g. a liquid level sensor; not shown) and permits the communication of the tank 22 and the second liquid conduits 19B, such that the developer 12 can be pushed out through the liquid outlets 192 or the nozzles 21 simultaneously to the substrate 2. The tank 22 provides a function of buffering and stabilizing the flow rate of the developer flowing into the second liquid conduits 19B.

Figure 6:
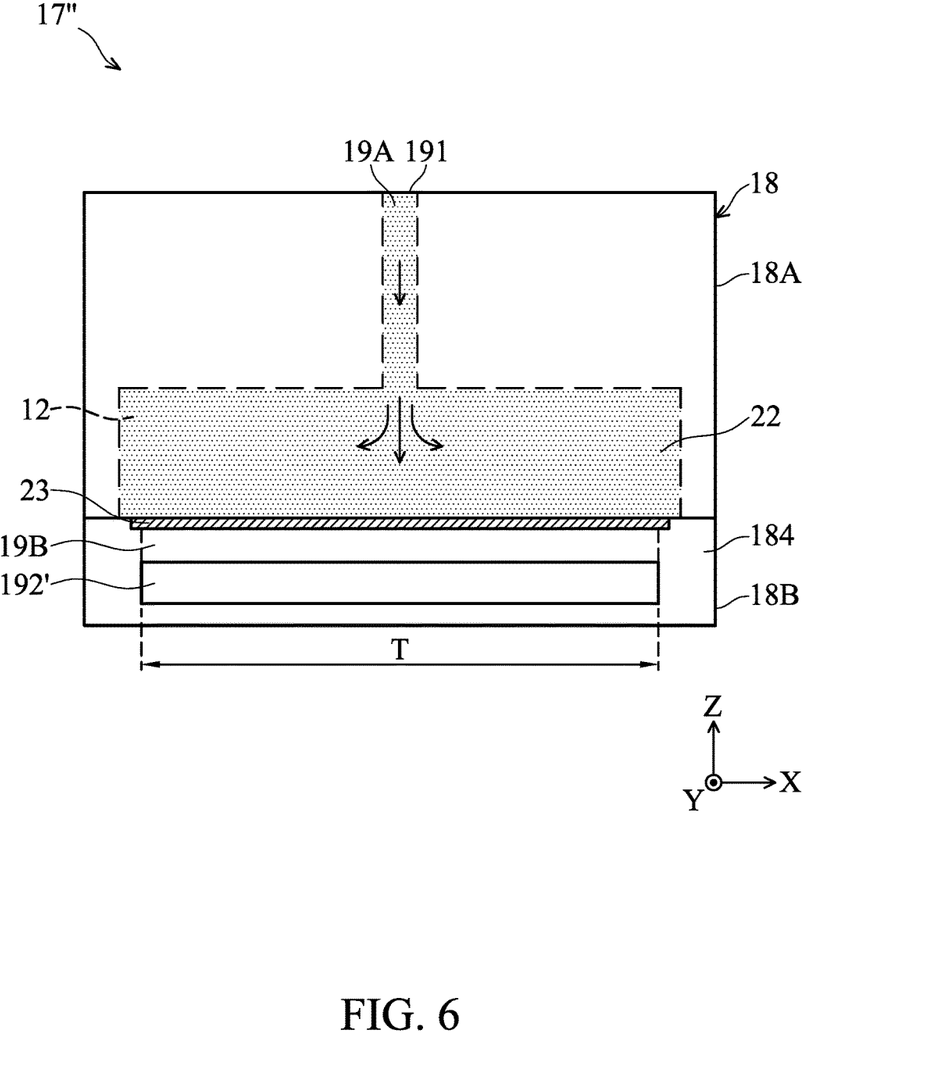
FIG. 6 schematically shows the structure and/or component in a dispensing head in accordance with some embodiments.

FIG. 6 schematically shows the structure and/or component in a dispensing head 17" in accordance with other some embodiments. The dispensing head 17" differs from the dispensing head 17' (FIG. 5) described above in that an elongated opening (i.e. an elongated liquid outlet 192') is provided to replace the liquid outlets 192 and the nozzles 21 in FIGS. 2 and 3. The elongated liquid outlet 192' extends along the long-axis L of the inclined surface 184. In some embodiments, the length T of the elongated liquid outlet 192' determines the dispensing area (e.g. the elongated area R) on the substrate 2. In addition, as shown in FIG. 6, the elongated liquid outlet 192' is connected to the tank 22 via one second liquid conduit 19B, and a control valve 23 is provided in the second liquid conduit 19B to control the communication between the tank 22 and the second liquid conduit 19B in a similar manner as described above.

Figure 7:
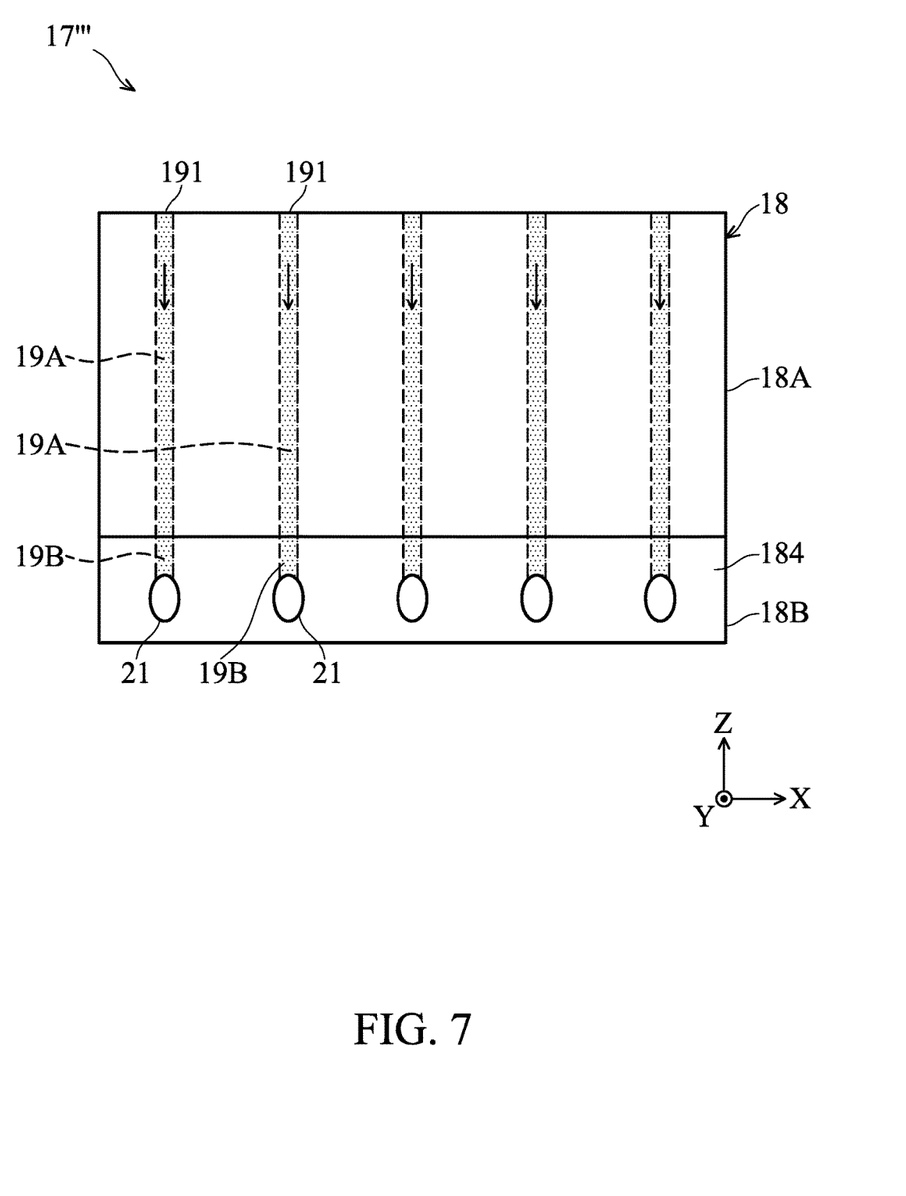
FIG. 7 schematically shows the structure and/or component in a dispensing head in accordance with some embodiments.

FIG. 7 schematically shows the structure and/or component in a dispensing head 17' in accordance with other some embodiments. The dispensing head 17' differs from the dispensing head 17 (FIGS. 2 and 3) described above in that a number of first liquid conduits 19A are provided in the upper housing part 18A to directly connect the second liquid conduits 19B in the lower housing part 18B, and the liquid rectifier 20 in FIGS. 2 and 3 is omitted. To work with this dispensing head 17''', the conduit 16 (FIG. 1) of the developer dispensing apparatus 1 can be divided into several branches to respectively connect the first liquid conduits 19A, and the developer 12 flowing in the branches may have the same flow rate.

The embodiments of the dispensing heads 17', 17" and 17''' shown in FIGS. 5 to 7 can also spray the developer 12 onto an elongated area R (FIG. 9) on the substrate 2 simultaneously via the liquid outlets 192 or the nozzles 21, and the developer 12 is sprayed onto the substrate 2 in an oblique manner, similar to the embodiments of the dispensing head 17 shown in FIGS. 1 to 4B.

Figure 8:
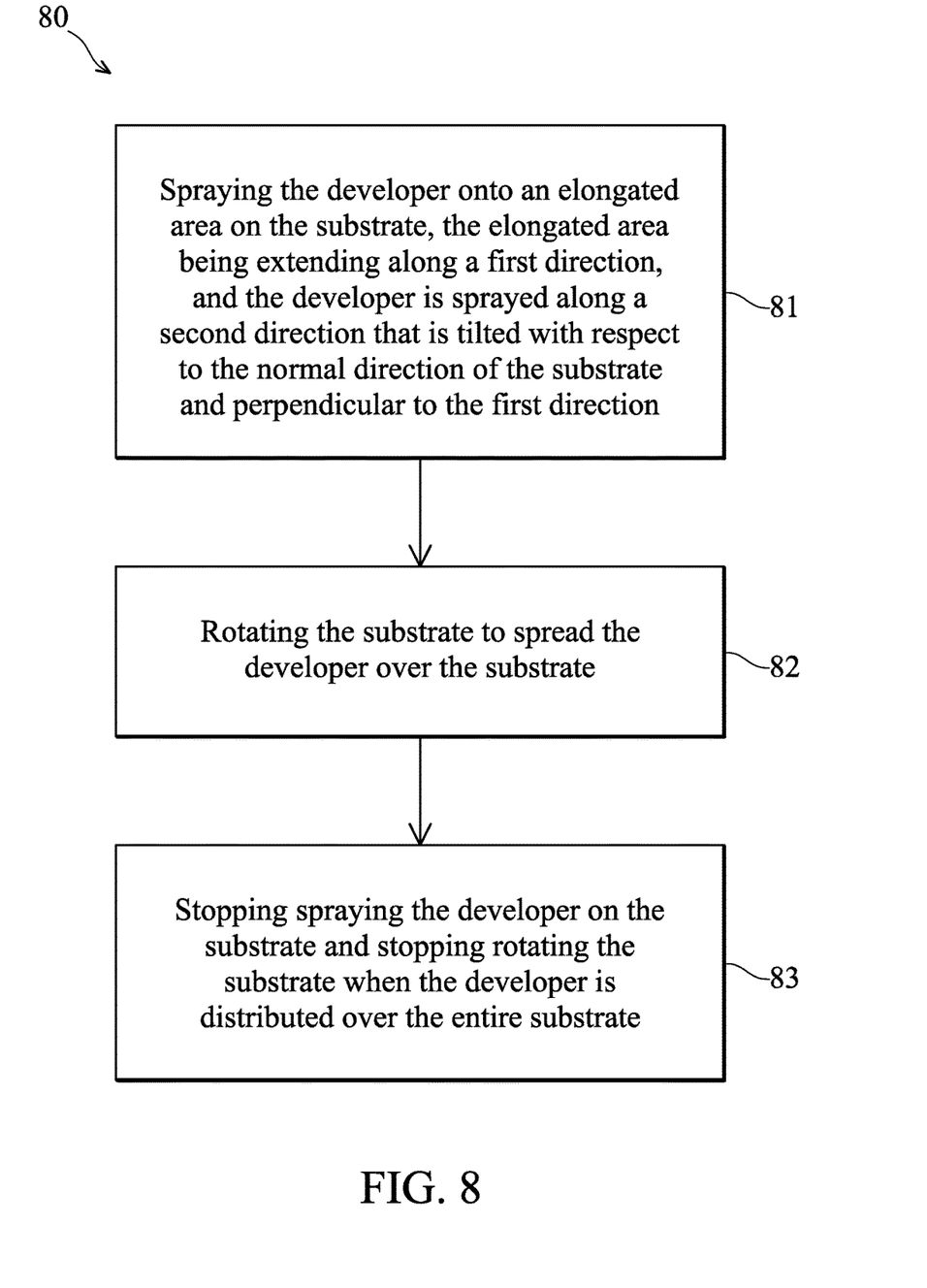
FIG. 8 is a flow chart illustrating a method for dispensing a developer over a substrate, in accordance with some embodiments.

FIG. 8 is a flow chart illustrating a method 80 for dispensing a developer over a substrate, in accordance with some embodiments. For illustration, the flow chart will be described in company with the schematic views shown in FIGS. 9 to 10. Some of the operations described below can be replaced or eliminated in different embodiments. Alternatively, some operations may be added in different embodiments. The method 80 includes a number of operations (81, 82, 83).

Figure 9:
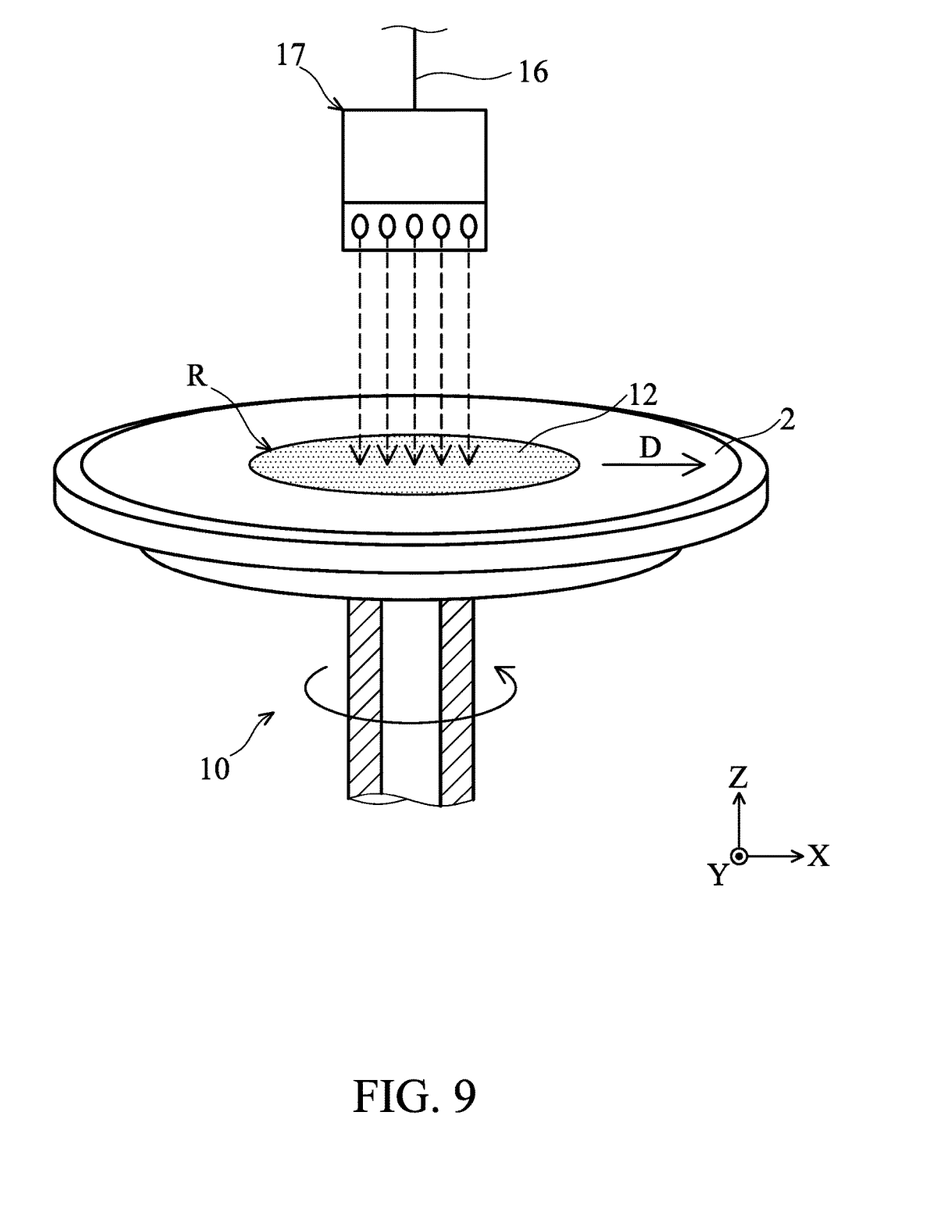
FIG. 9 schematically shows an intermediate stage of a method for dispensing a developer over a substrate, in accordance with some embodiments.

In operation 81, a developer 12 (FIG. 1) is dispensed over the substrate 2 via a dispensing head (e.g. the dispensing head 17 shown in FIGS. 1 to 4). In some embodiments, as shown in FIG. 9, the developer 12 is sprayed substantially over a center area on the substrate 2. In some embodiments, the dispensing head 17 sprays the developer 12, through the liquid outlets 192 or the nozzles 21, over an elongated area R on the substrate 2. The elongated area R extends along a linear direction D of the substrate 2 and includes a plurality of dies along the linear direction D. In addition, the elongated area R is located away from an edge of the substrate 2. In some embodiments, the developer 12 is sprayed onto a fixed elongated area R on the substrate 2 in the operation of spraying the developer 12 on the substrate 2. That is to say, the dispensing head 17 does not move to change the dispensing area while it sprays the developer 12 onto the substrate 2. However, the elongated area R (i.e. the dispensing area of the dispensing head 17) may be varied in some embodiments.

In some embodiments, in the operation of spraying the developer 12 on the substrate 2, the developer 12 is also sprayed by the dispensing head 17 along a dispensing direction S that is tilted with respect to the normal direction N (FIG. 4A) of the substrate 2 (and perpendicular to the extension direction of the elongated area R, as shown in FIG. 4B). In some embodiments, an angle at about 30 degrees to about 60 degrees is formed between dispensing direction S and the normal direction N of the substrate 2. In some embodiments, the spraying speed of the developer 12 is about 150 ml/min to about 300 ml/min in the operation of spraying the developer 12 on the substrate 2 via the nozzles 21 of the dispensing head 17. In some embodiments, the developer 12 is sprayed continuously or intermittently onto the elongated area R on the substrate 2 in the operation of spraying the developer 12 on the substrate 2.

Figure 10:
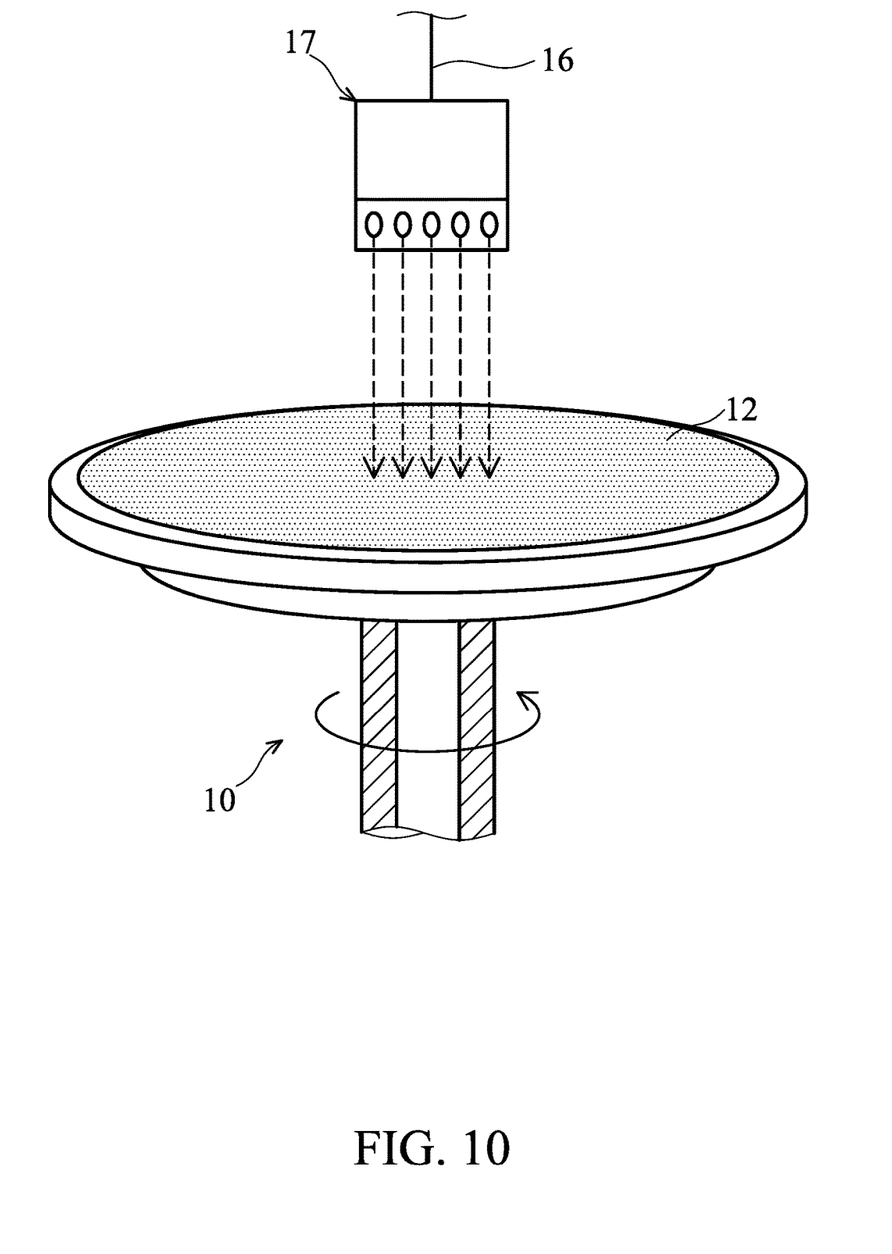
FIG. 10 schematically shows an intermediate stage of a method for dispensing a developer over a substrate, in accordance with some embodiments.

In operation 82, the substrate 2 is rotated to spread the developer 12 over the substrate 2. In some embodiments, the developer 12 is spread radially outward from the center area of the substrate 2 until the entire substrate 2 is covered with the developer 12, as shown in FIG. 10. Excess developer 12 is spun off the rotating substrate 2 in the operation of rotating the substrate 2. In some embodiments, the substrate 2 is rotated by the substrate stage 10 at a variable speed in the operation of rotating the substrate 2. For example, the rotational speed of the substrate 2 may be gradually increased and then gradually decreased in the operation of rotating the substrate 2. In some embodiments, the substrate 2 is rotated by the substrate stage 10 at a speed of about 200 revolutions per minute (rpm) to about 2500 rpm in the operation of rotating the substrate 2. In some embodiments, the operation of spraying the developer 12 on the substrate 2 and the operation of rotating the substrate 2 are performed simultaneously. In some embodiments, the operation of rotating the substrate 2 is performed before, during, and after the operation of spraying the developer 12 on the substrate 2.

In operation 83, stop spraying the developer 12 onto the substrate 2 and stop rotating the substrate 2 when the developer 12 is distributed over the entire substrate 2.

According to some embodiments of the present disclosure, through the dispensing head described above, the photoresist developer is sprayed obliquely onto an elongated area including a plurality of dies on the substrate, so that the developer can be spread over the entire substrate (including the center area and edge area) rapidly through rotation of the substrate. Accordingly, the contact time (i.e. the development time) of the developer and the entire substrate (including the center region and edge region) is more consistent. As a result, the CDU and the CD range (either within-die or across-dies on the substrate) in the photoresist development step can thus be improved (i.e. reduced). Furthermore, the fabrication yield of the lithography process is also improved.

In some embodiments, a dispensing head for dispensing a developer onto a substrate is provided. The dispensing head includes a housing configured to receive the developer. The dispensing head further includes at least one liquid outlet provided on the housing. The liquid outlet is configured to spray the developer onto an elongated area on the substrate.

Also, the liquid outlet is configured to spray the developer along a dispensing direction that is tilted with respect to the normal direction of the substrate and perpendicular to the long-axis direction of the elongated area.

In some embodiments, a dispensing head for dispensing a developer onto a substrate is provided. The dispensing head includes a housing configured to receive the developer, and the housing includes an elongated surface close to the substrate. The dispensing head further includes a plurality of nozzles extending from the elongated surface. The nozzles are configured to spray the developer onto an elongated area on the substrate in an oblique manner.

In some embodiments, a method for dispensing a developer over a substrate is provided. The method includes spraying the developer onto an elongated area on the substrate, the elongated area being extending along a first direction. In particular, the developer is sprayed along a second direction that is tilted with respect to the normal direction of the substrate and perpendicular to the first direction. The method further includes rotating the substrate to spread the developer over the substrate.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A dispensing head for dispensing a developer onto a substrate, comprising:
    a housing configured to receive the developer;
    a first liquid conduit provided in the housing to receive the developer;
    a plurality of second liquid conduits provided in the housing and defining a plurality of liquid outlets on an inclined surface of the housing close to the substrate;
    a liquid rectifier interconnecting the first liquid conduit and the second liquid conduits to allow the developer in the first liquid conduit to be evenly distributed into the second liquid conduits, wherein the liquid outlets are configured to spray the developer onto an elongated area on the substrate, and each of the liquid outlets is configured to spray the developer along a dispensing direction that is tilted with respect to a normal direction of the substrate and perpendicular to a long-axis direction of the elongated area.

2. The dispensing head as claimed in claim 1, wherein the inclined surface is an elongated surface having a long-axis that extends along a linear direction from a center to an edge of the substrate.

3. The dispensing head as claimed in claim 2, wherein the liquid outlets are arranged in a row along the long-axis of the inclined surface.

4. The dispensing head as claimed in claim 3, wherein the liquid outlets are arranged at equal intervals.

5. The dispensing head as claimed in claim 4, wherein the liquid outlets have the same shape and size.

6. The dispensing head as claimed in claim 3, further comprising a plurality of nozzles correspondingly connected to the liquid outlets and each extending from the inclined surface in the dispensing direction.

7. The dispensing head as claimed in claim 6, wherein the nozzles are arranged along the long-axis of the inclined surface with equal intervals.

8. The dispensing head as claimed in claim 7, wherein nozzle holes of the nozzles have the same shape and size.

9. The dispensing head as claimed in claim 1, wherein an angle more than zero degrees is formed between the inclined surface and the dispensing direction.

10. The dispensing head as claimed in claim 1, further comprising a plurality of O-rings provided at junctions between the liquid rectifier, the first liquid conduit, and the second liquid conduits.

11. A method for dispensing a developer over a substrate, comprising:
    beginning to spray the developer by a dispensing head onto an elongated area on the substrate after the dispensing head is positioned over the center area of the substrate, the elongated area being corresponding to the center area of the substrate and extending along a first direction, and the developer is sprayed along a second direction that is tilted with respect to a normal direction of the substrate and perpendicular to the first direction, wherein the developer is sprayed onto a fixed elongated area on the substrate in the operation of spraying the developer on the substrate; and
    rotating the substrate to spread the developer over the substrate.

12. The method as claimed in claim 11, wherein the elongated area is located away from an edge of the substrate.

13. The method as claimed in claim 11, wherein the developer is sprayed continuously or intermittently onto the elongated area on the substrate in the operation of spraying the developer on the substrate.

14. The method as claimed in claim 13, wherein the substrate is rotated at a variable speed in the operation of rotating the substrate.

15. The method as claimed in claim 14, wherein the operation of spraying the developer on the substrate and the operation of rotating the substrate are performed simultaneously.

16. The method as claimed in claim 11, wherein a speed of spraying the developer onto the substrate is about 150 ml/min to about 300 ml/min.

17. The method as claimed in claim 11, wherein the substrate is rotated at a speed of about 200 rpm to about 2500 rpm.

18. A dispensing head for dispensing a developer onto a substrate, comprising:
    a housing configured to receive the developer, wherein the housing has an inclined surface close to the substrate, and the inclined surface is an elongated surface having a long-axis that extends along a linear direction from a center to an edge of the substrate; and an elongated liquid outlet provided on the inclined surface of the housing and extending along the long-axis of the inclined surface, wherein the elongated liquid outlet is configured to spray the developer onto an elongated area on the substrate, and the elongated liquid outlet is configured to spray the developer along a dispensing direction that is tilted with respect to a normal direction of the substrate and perpendicular to a long-axis direction of the elongated area.

19. The dispensing head as claimed in claim 18, further comprising:

a first liquid conduit provided in the housing to receive the developer;

a second liquid conduit provided in the housing and defining the elongated liquid outlet on the inclined surface of the housing;

a tank interconnecting the first liquid conduit and the second liquid; and a control valve provided in the second liquid conduit.

20. The dispensing head as claimed in claim 18, wherein a length of the elongated liquid outlet determines the elongated area on the substrate where the developer is sprayed.

* * * * *